(12) United States Patent
Zimmer

(10) Patent No.: US 9,817,085 B2
(45) Date of Patent: Nov. 14, 2017

(54) FREQUENCY DOUBLING OF XMR SIGNALS

(75) Inventor: Juergen Zimmer, Neubiberg (DE)

(73) Assignee: Infineon Technologies AG, Neubiberg (DE)

( * ) Notice: Subject to any disclaimer, the term of this patent is extended or adjusted under 35 U.S.C. 154(b) by 233 days.

(21) Appl. No.: 13/421,008

(22) Filed: Mar. 15, 2012

(65) Prior Publication Data

US 2013/0241544 A1  Sep. 19, 2013

(51) Int. Cl.
| | |
|---|---|
| G01R 33/09 | (2006.01) |
| G01P 3/487 | (2006.01) |
| G01P 3/488 | (2006.01) |
| G01P 3/489 | (2006.01) |
| G01D 5/245 | (2006.01) |

(52) U.S. Cl.
CPC ......... G01R 33/093 (2013.01); G01D 5/2451 (2013.01); G01P 3/487 (2013.01); G01P 3/488 (2013.01); G01P 3/489 (2013.01); G01R 33/098 (2013.01)

(58) Field of Classification Search
CPC .... G01R 33/09; G01R 33/093; G01R 33/098; G01R 33/03; G01D 5/145; G01D 5/147; G01D 5/24438; G01P 3/48; G01P 3/487; G01P 3/488; G01P 3/489
USPC .. 324/252, 166, 173, 207.2, 207.21, 207.22, 324/207.25, 165, 174
See application file for complete search history.

(56) References Cited

U.S. PATENT DOCUMENTS

| | | | | |
|---|---|---|---|---|
| 5,602,946 | A * | 2/1997 | Veeser et al. ................. | 385/12 |
| 5,680,042 | A * | 10/1997 | Griffen ................. | G01P 3/487 324/207.21 |
| 5,939,879 | A * | 8/1999 | Wingate ................. | G01D 5/202 324/207.17 |
| 5,964,815 | A * | 10/1999 | Wallace ................. | B60R 21/01 180/282 |
| 6,300,758 | B1 * | 10/2001 | Griffen et al. ........... | 324/207.21 |
| 6,417,662 | B1 * | 7/2002 | Wallrafen ................ | 324/174 |
| 6,445,178 | B1 * | 9/2002 | Hoekstra .......... | B60G 17/01933 324/202 |
| 7,084,619 | B2 * | 8/2006 | Butzmann ................ | 324/165 |

(Continued)

FOREIGN PATENT DOCUMENTS

DE  4446313 A1 * 6/1996

OTHER PUBLICATIONS

Lenord & Bauer, 2 Channel Speed Sensor Gel 2477: Sensor with Pulse Multiplier, pp. 1-8, Version 05.09 as available on Mar. 15, 2012, at http://www.lenord.de/de/produkte/sensorline/drehzahlsensoren/gel2477/TI2477_e.pdf.

(Continued)

Primary Examiner — Huy Q Phan
Assistant Examiner — David Frederiksen
(74) Attorney, Agent, or Firm — Schiff Hardin LLP

(57) ABSTRACT

Embodiments relate to sensors, such as speed sensors and angle sensors, that use a modulated supply voltage to approximately double output signals of the sensors because the sensor element and the supply voltage exhibit the same frequency. In embodiments, the sensor element is an xMR element, and the modulated supply voltage is generated on-chip, such as by another xMR element. Direct frequency doubling of the output signal of the sensor element therefore can be obtained without additional and complex circuitry or signal processing.

26 Claims, 3 Drawing Sheets

(56) References Cited

U.S. PATENT DOCUMENTS

| | | | |
|---|---|---|---|
| 7,915,886 B2* | 3/2011 | Stolfus | G01P 3/487 324/165 |
| 8,369,660 B1* | 2/2013 | Cranch | 385/12 |
| 8,390,283 B2* | 3/2013 | Mather | B82Y 25/00 324/244 |
| 8,755,643 B2* | 6/2014 | Nash | G01D 5/35383 385/12 |
| 2004/0012389 A1* | 1/2004 | Maiwald | G01R 33/093 324/252 |
| 2004/0100251 A1* | 5/2004 | Lohberg | 324/166 |
| 2004/0217754 A1* | 11/2004 | Shirai et al. | 324/166 |
| 2005/0179429 A1* | 8/2005 | Lohberg | G01P 3/489 324/207.13 |
| 2005/0285601 A1* | 12/2005 | Seto | G01R 17/105 324/526 |
| 2006/0103381 A1* | 5/2006 | Schmollngruber | B82Y 25/00 324/252 |
| 2007/0046102 A1* | 3/2007 | Reithofer | G01D 5/145 307/10.1 |
| 2007/0164723 A1* | 7/2007 | Yanagisawa | G01R 15/16 324/76.11 |
| 2008/0116886 A1* | 5/2008 | Yamada et al. | 324/207.21 |
| 2008/0186019 A1* | 8/2008 | Hinz | 324/207.21 |
| 2009/0271089 A1* | 10/2009 | Sekimoto | F02D 41/009 701/103 |
| 2009/0278711 A1* | 11/2009 | Lohberg et al. | 341/11 |
| 2010/0001723 A1* | 1/2010 | Van Zon et al. | 324/252 |
| 2010/0090690 A1* | 4/2010 | Lohberg et al. | 324/207.25 |
| 2010/0164711 A1* | 7/2010 | Arms et al. | 340/539.1 |
| 2010/0231213 A1* | 9/2010 | Nieuwenhuis | B82Y 25/00 324/252 |
| 2010/0271013 A1* | 10/2010 | Servel et al. | 324/207.21 |
| 2013/0049748 A1* | 2/2013 | Sebastiano | G01R 33/0017 324/252 |

OTHER PUBLICATIONS

China Patent Office, Office Action issued for CN patent application No. 201310156228.5, dated May 19, 2015.

* cited by examiner

FREQUENCY DOUBLING OF XMR SIGNALS

TECHNICAL FIELD

The invention relates generally to magnetoresistive (xMR) sensors and more particularly to increasing a frequency of xMR-based sensor signals.

BACKGROUND

High accuracy is desired in speed and angle sensors. For speed sensors, a highly accurate sampling of the transducer wheel is desired in order to get an optimum angle resolution. Where pole wheels are the transducer wheel, an increase in the number of poles at a certain wheel diameter can support a resolution enhancement but at the expense of the magnetic field and, thereby, the working distance.

For speed sensors based on angle sensors, such as xMR sensors in a "top read" configuration in which the sensor is positioned on the face side of the pole wheel such that rotating field vectors are detected, frequency doubling can be used to overcome a compatibility problem between AMR and GMR/TMR sensors. AMR angle sensors exhibit inherent 180-degree uniqueness, while GMR and TMR sensors have 360-degree uniqueness, i.e. upon a rotating magnetic field a 360-degree rotation results in a single period of the output signal for the GMR/TMR angle sensor and a double period for the AMR angle sensor. With a frequency doubling of the GMR/TMR angle sensors, AMR sensors easily could be replaced by GMR/TMR sensors without changing the related signal evaluation circuitry. Both high accuracy and high resolution typically are desired for angle sensors, at least within a limited range.

Conventional solutions suffer from drawbacks. For example, some speed sensors use a digital pulse multiplication technique, which involves an incremental interpolation of the output signal on an external magnetic field. Disadvantages of such an approach are complex circuitry and that a full magnetic field period is needed to enable the interpolation and multiplication, which does not work for small angle ranges. Other magnetoresistive speed sensors use the inherent frequency doubling property of AMR angle sensors in a "top read" configuration in combination with magnetic pole wheels, which also present disadvantages with respect to smaller signal size.

Therefore, there is a need for improved speed and angle sensors.

SUMMARY

Embodiments relate to magnetoresistive sensors.

In an embodiment, a sensor system comprises a magnetic field source; a magnetoresistive sensor configured to provide an output signal related to the magnetic field source, the output signal having a frequency; and a voltage supply coupled to the sensor element to provide a modulated supply voltage having a frequency the same as the frequency of the sensor element output signal.

In an embodiment, a method comprises providing a sensor having a response to an external magnetic field; and providing a supply voltage to the sensor having substantially the same frequency as the response of the sensor.

In an embodiment, a sensor system comprises a magnetoresistive sensor comprising a first sensor element configuration and a second sensor element configuration; and a voltage supply coupled to the sensor to provide a supply voltage modulated by an output signal of the second sensor element configuration to the first sensor element configuration.

In an embodiment, a sensor system for measuring a parameter of a rotating magnetic field comprises a first magnetoresistive (xMR) sensor bridge; and a second xMR sensor bridge, wherein the first and second xMR sensor bridges are coupled to each other such that a signal tapped from the first xMR sensor bridge has double a frequency of the rotating magnetic field.

In an embodiment, a sensor system for determining at least one parameter of rotation of a magnetic field comprises a magnetoresistive (xMR) sensor bridge arrangement comprising first and second xMR sensor bridges configured such that an analog output signal of the xMR sensor bridge arrangement has a signal frequency double a frequency of the rotation of the magnetic field.

BRIEF DESCRIPTION OF THE DRAWINGS

The invention may be more completely understood in consideration of the following detailed description of various embodiments of the invention in connection with the accompanying drawings, in which.

Figure 1:
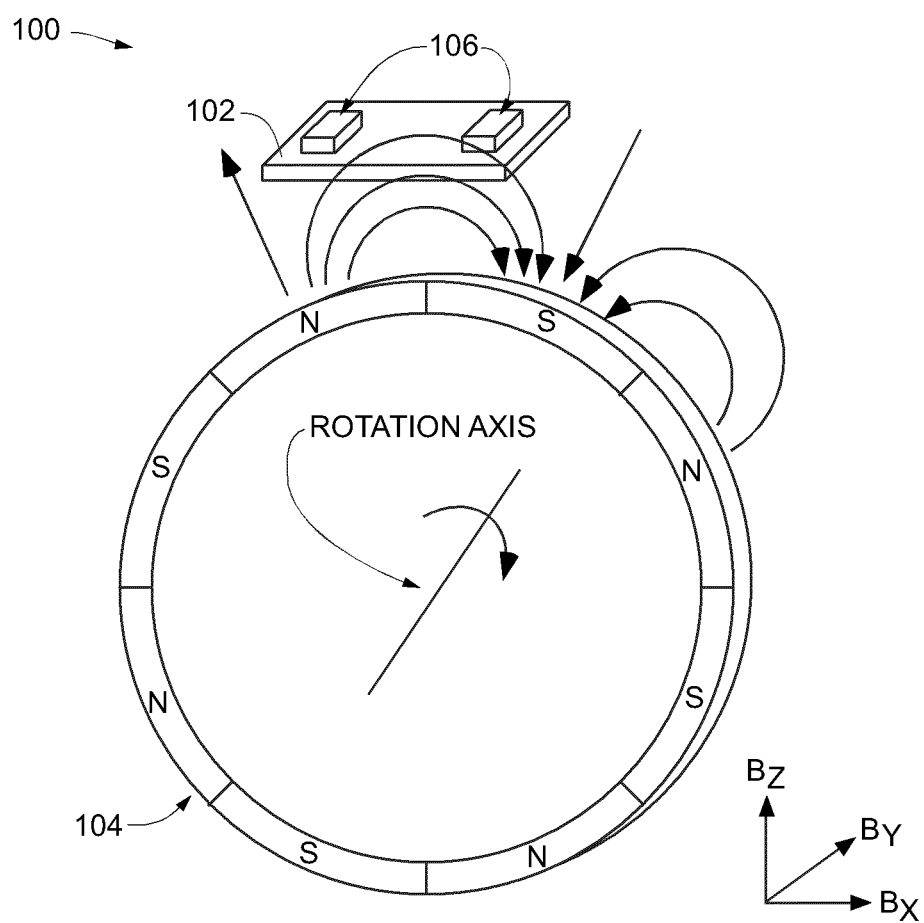
FIG. 1 depicts a sensor device and a pole wheel according to an embodiment.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

Embodiments relate to sensors, such as speed sensors and angle sensors, that use a modulated supply voltage to approximately double output signals of the sensors because the sensor element and the supply voltage exhibit the same frequency. In embodiments, the sensor element is an xMR element, and the modulated supply voltage is generated on-chip, such as by another xMR element. Direct frequency doubling of the output signal of the sensor element therefore can be obtained without additional and complex circuitry or signal processing.

FIG. 1 depicts a conventional speed sensor and pole wheel system 100. System 100 comprises a speed sensor 102 and a pole wheel 104. Speed sensor 102 comprises an xMR structure 106, such as GMR, having two spaced-apart Wheatstone half-bridges. The distance of the poles or tooth pitch of pole wheel 104 is configured such that the magnetic field at the left and right half-bridges 106 is shifted by 180 degrees. Therefore, a differential output signal is obtained when pole wheel 106 rotates.

At a point midway between the two xMR half-bridges 106, the magnetic field is shifted by 90 degrees with respect to the phase at the half-bridges 106. Thus, if the left and right half-bridges 106 deliver a $\sin_{MR}(\alpha)$ and $-\sin_{MR}(\alpha)$, respectively, a Wheatstone bridge structure in the middle delivers a $\cos_{MR}(\alpha)$ signal, with a being the phase of the excitation magnetic field.

Figure 2:
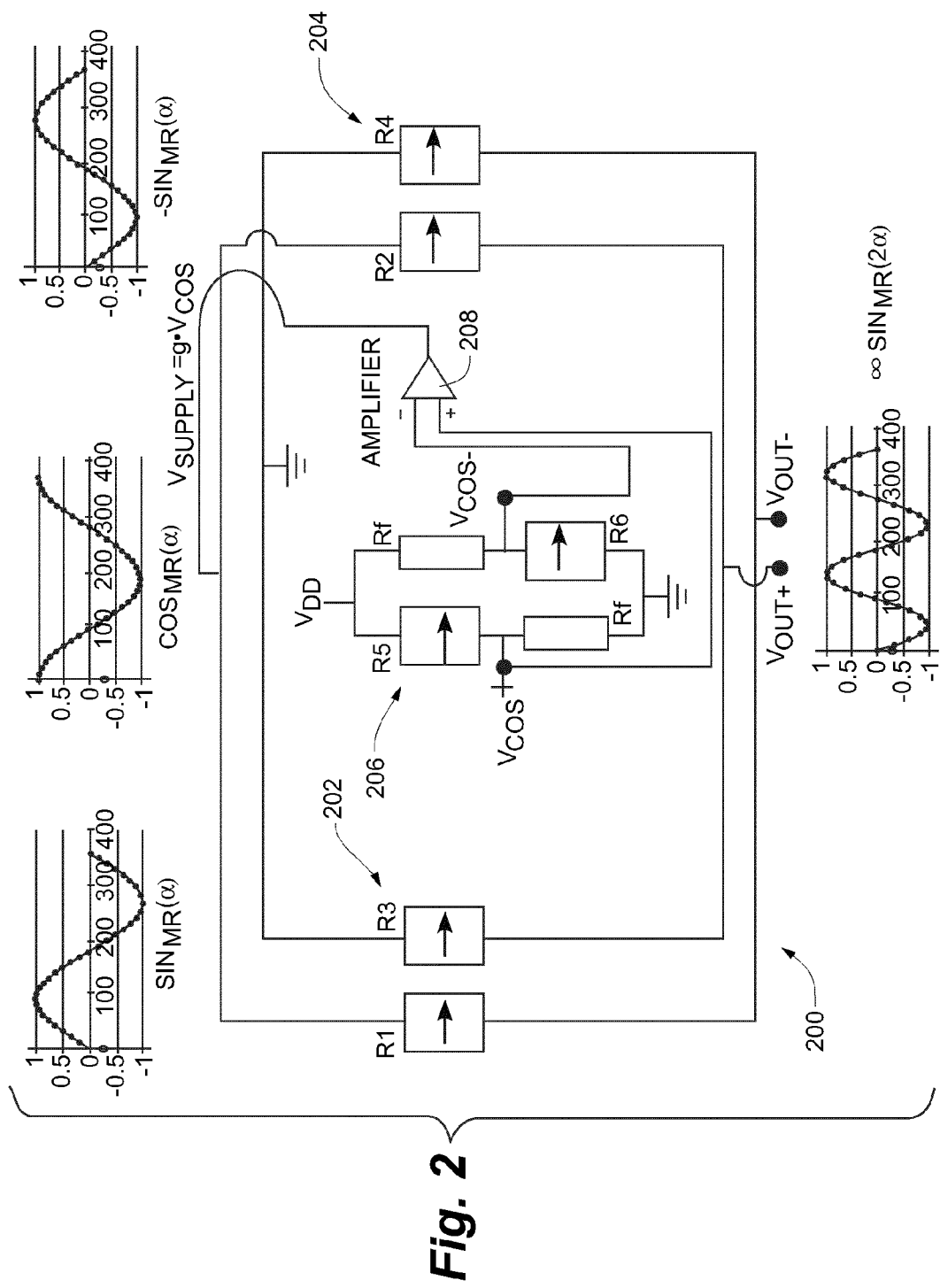
FIG. 2 depicts a schematic diagram of a sensor according to an embodiment.

Accordingly, in an embodiment a sensor system, such as a speed sensor and pole wheel system or an angle sensor system, comprises an additional bridge structure as part of the sensor configuration. Referring to FIG. 2, an embodiment of a sensor system 200 comprises a left half-bridge structure 202, a right half-bridge structure 204 and a middle bridge structure 206. Middle bridge structure 206 can comprise a full or half Wheatstone bridge, a resistance or some other suitable structure in embodiments, with one example depicted in FIG. 2. In an embodiment in which one reference magnetization direction for all GMR elements is available, middle bridge 206 is configured as a half-bridge with two fixed resistances of similar value. The arrows in FIG. 2 indicate the reference layer magnetization of the GMR spin-valve stack, with all being the same in an embodiment to provide a cost-effective wafer-level magnetization process.

In embodiments, a signal from middle bridge structure 206 is fed back to each of left and right bridge structures 202 and 204 via an amplifier 208 such that $V_{supply}$ becomes $g \times V_{cos}(\alpha)$, where g is the amplification factor of amplifier 208. Given $\sin(\alpha) \times \cos(\alpha) = \frac{1}{2} \sin(2\alpha)$, the new bridge output signal is:

$$V_{OUT}(\alpha) = V_{supply} \cdot \frac{dR_{MRspeed}}{R_{MRspeed}} \sin_{MR}(\alpha)$$

$$= V_{DD} \cdot \frac{dR_{MRMiddle}}{R_{MRmiddle}} \cdot g \cdot \cos_{MR}(\alpha) \cdot \frac{dR_{MRSpeed}}{R_{MRSpeed}} \sin_{MR}(\alpha)$$

$$= \frac{1}{2} V_{DD} \frac{dR_{MRmiddle}}{R_{MRmiddle}} \cdot \frac{dR_{MRSpeed}}{R_{MRSpeed}} \cdot g \cdot \sin_{MR}(2\alpha) \propto \sin_{MR}(2\alpha)$$

where $dR_{MRMiddle}/R_{MRMiddle}$ and $dR_{MRSpeed}/R_{MRSpeed}$ denote the xMR output sensitivity for the middle 206 and left/right 202/204 Wheatstone bridges, respectively, and $V_{DD}$ is the supply voltage of middle Wheatstone bridge. By this measure, the new output signal follows a $\sin(2\alpha)$ behavior instead of $\sin(\alpha)$. In other words, a frequency doubled signal is generated by the speed sensing Wheatstone bridge 200 itself, in a simple way and without complex circuitry.

Figure 3:
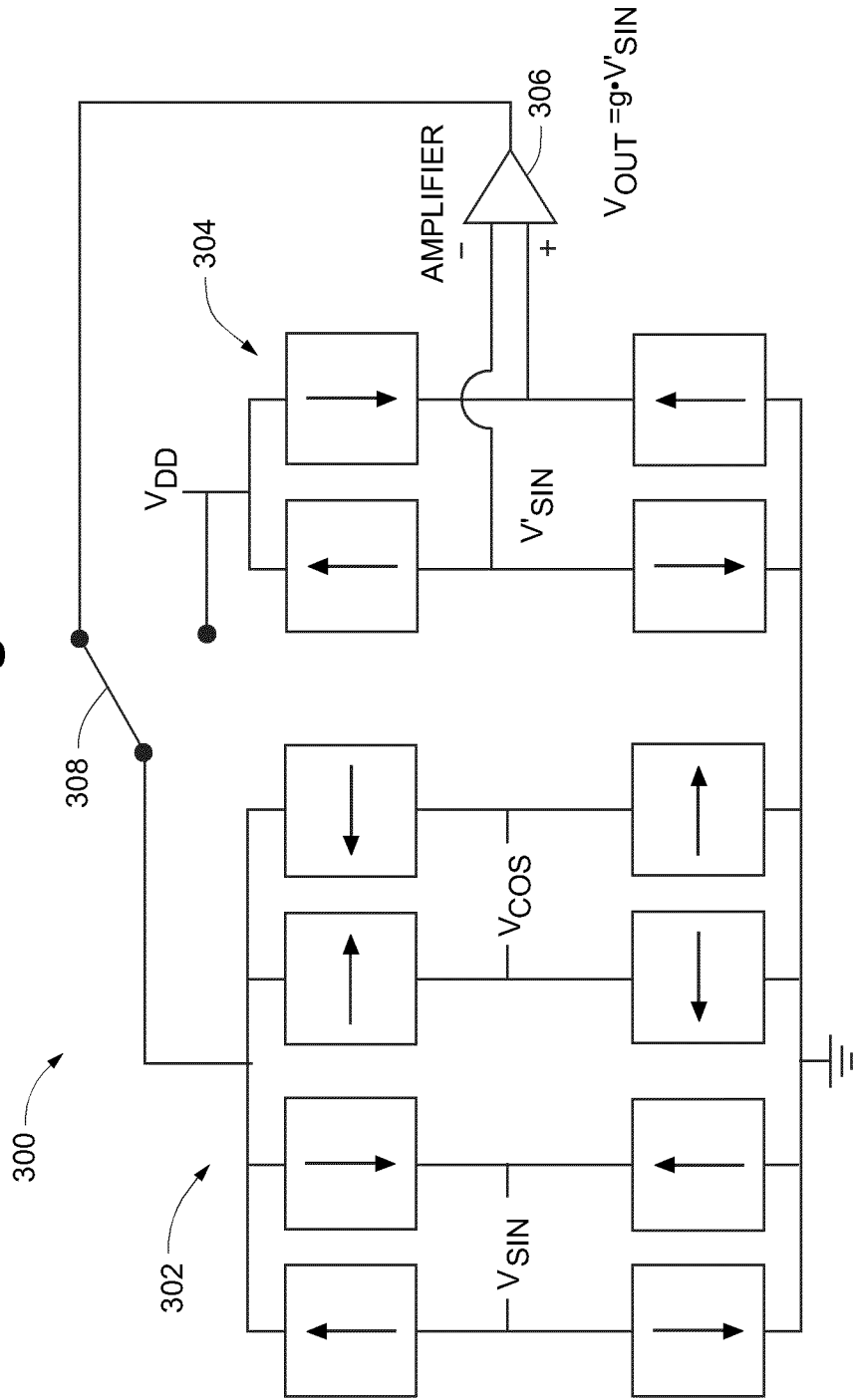
FIG. 3 depicts a schematic diagram of a sensor according to an embodiment.

Another embodiment is depicted in FIG. 3. Sensor system 300 has a Wheatstone bridge element 302 of a standard GMR/TMR angle sensor layout with a differential output $V_{sin}$ and $V_{cos}$ in combination with an additional Wheatstone bridge element 304 delivering a $V'_{sin}$ signal. The arrows in FIG. 3 indicate the magnetization direction of the reference layer of the GMR/TMR spin valve stack.

Typically, the $V_{sin}$ and $V_{cos}$ signals follow a $\sin(\alpha)$ and $\cos(\alpha)$ behavior given an external rotating magnetic field with an angle $\alpha$ when a constant supply voltage is applied to the sensor bridge. By an arctan calculation, a determination of the external magnetic field angle with 360-degree uniqueness is possible. According to an embodiment, an additional Wheatstone bridge 304 delivers a $\sin(\alpha)$-like (or $\cos(\alpha)$-like) output signal, which is amplified by an amplifier 306 having an amplification factor g.

Given that $\sin'(\alpha) \times \cos(\alpha) = \frac{1}{2} \sin(2\alpha)$ and $\sin'(\alpha) \times \sin(\alpha) = -\frac{1}{2} \cos(2\alpha) + \frac{1}{2}$, the sin ($\alpha$) and cos ($\alpha$) output signals follow a $\cos(2\alpha)$ and $\sin(2\alpha)$ characteristic when the V' sin signal is fed back, after amplification, to the supply input of the angle sensor double Wheatstone bridge 302. Because one of the output signals is afflicted with an offset ($\sin'(\alpha) \times \sin(\alpha) = -\frac{1}{2} \cos(2\alpha) + \frac{1}{2}$), a calibration can be done, and only once in embodiments. Additionally, the difference in signs of the sin and cos bridges should be taken into account.

Further, the angle range of a unique calculated angle value is halved, which can be a drawback in some applications. This can be addressed in embodiments by switching off the modulated supply voltage and replacing it with a constant supply voltage $V_{DD}$. In FIG. 3, a switch 308 provides this switching capability. This enables sensor 300 to keep the full 360-degree angle uniqueness if a GMR structure is used, in combination with an enhanced angle resolution. Typically, 360-degree uniqueness is needed for sensor start-up only, with the number of 180-degree rotations counted thereafter. Consequently, the switching of the supply voltage does not affect the sensor speed during use.

Embodiments therefore provide a frequency doubling of a sensor element output signal without complex signal processing. For example, in an embodiment comprising first and second xMR sensor bridges, the bridges are coupled to one another such that a signal tapped from the first sensor bridge has double the frequency of a rotating external magnetic field. In another example, the first and second xMR sensor bridges are configured such that an analog output signal of the xMR sensor bridge arrangement has a signal frequency that is double the frequency of an external magnetic field. Embodiments are suitable for angle and speed sensing devices, among others, including magnetoresistive devices such as GMR, AMR and TMR.

Various embodiments of systems, devices and methods have been described herein. These embodiments are given only by way of example and are not intended to limit the scope of the invention. It should be appreciated, moreover, that the various features of the embodiments that have been described may be combined in various ways to produce numerous additional embodiments. Moreover, while various materials, dimensions, shapes, configurations and locations, etc. have been described for use with disclosed embodiments, others besides those disclosed may be utilized without exceeding the scope of the invention.

Persons of ordinary skill in the relevant arts will recognize that the invention may comprise fewer features than illustrated in any individual embodiment described above. The embodiments described herein are not meant to be an exhaustive presentation of the ways in which the various features of the invention may be combined. Accordingly, the embodiments are not mutually exclusive combinations of features; rather, the invention may comprise a combination of different individual features selected from different individual embodiments, as understood by persons of ordinary skill in the art.

Any incorporation by reference of documents above is limited such that no subject matter is incorporated that is contrary to the explicit disclosure herein. Any incorporation by reference of documents above is further limited such that no claims included in the documents are incorporated by reference herein. Any incorporation by reference of documents above is yet further limited such that any definitions provided in the documents are not incorporated by reference herein unless expressly included herein.

For purposes of interpreting the claims for the present invention, it is expressly intended that the provisions of Section 112, sixth paragraph of 35 U.S.C. are not to be invoked unless the specific terms "means for" or "step for" are recited in a claim.

What is claimed is:

1. A sensor system comprising:
a magnetic field source;
a magnetoresistive sensor configured to provide an output signal related to the magnetic field source, the output signal having a frequency, wherein the sensor comprises a first half-bridge configuration of sensor elements and a second half-bridge configuration of sensor elements forming a first Wheatstone bridge configuration of sensor elements, and a second Wheatstone bridge configuration of sensor elements having a phase arranged between phases of the first and second half-bridge configurations; and
a voltage supply coupled to the sensor to provide a modulated supply voltage having a frequency the same as the frequency of the sensor output signal.

2. The sensor system of claim 1, wherein the modulated supply voltage doubles the frequency of the output signal as compared with an unmodulated supply voltage.

3. The sensor system of claim 1, wherein an output signal of the second Wheatstone bridge configuration of sensor elements is provided to a supply voltage input of the first Wheatstone bridge configuration of sensor elements to provide the modulated supply voltage.

4. The sensor system of claim 3, further comprising an amplifier, wherein the output signal of the second Wheatstone bridge configuration is provided to the supply voltage input of the first Wheatstone bridge configuration of sensor elements via the amplifier.

5. The sensor system of claim 1, wherein the sensor comprises at least one of a giant magnetoresistive sensor element (GMR), a tunneling magnetoresistive sensor element (TMR) or an anisotropic magnetoresistive sensor element (AMR).

6. A sensor system comprising:
a magnetic field source;
a magnetoresistive sensor configured to provide an output signal related to the magnetic field source, the output signal having a frequency; and
a voltage supply coupled to the sensor to provide a modulated supply voltage having a frequency the same as the frequency of the sensor output signal,
wherein the sensor comprises a first Wheatstone bridge configuration of sensor elements, a second Wheatstone bridge configuration of sensor elements, and a third Wheatstone bridge configuration of sensor elements, wherein an output signal of the first bridge configuration is phase-shifted by 90 degrees with respect to an output signal of the second bridge configuration, wherein an output signal of the third bridge configuration has substantially the same phase as one of the output signals of the first or second bridge configurations, and wherein the output signal of the third bridge configuration is provided to a supply voltage input of the first and second bridge configurations to provide the modulated supply voltage.

7. The sensor system of claim 6, further comprising an amplifier, wherein the output signal of the third bridge configuration is provided to the supply voltage input of the first and second bridge configurations via the amplifier.

8. The sensor system of claim 6, further comprising a switch configured to switch the supply voltage input of the first and second bridge configurations between the modulated supply voltage and a constant supply voltage.

9. A method comprising:
providing a sensor having a response to an external magnetic field, the sensor comprising a first half-bridge sensor configuration and a second half-bridge sensor configuration forming a first sensor configuration, and a second sensor configuration having a phase arranged between phases of the first and second half-bridge sensor configurations; and
providing a supply voltage to the sensor having substantially the same frequency as the response of the sensor.

10. The method of claim 9, wherein providing a supply voltage comprises modulating the supply voltage to the first sensor configuration by an output of the second sensor configuration.

11. The method of claim 10, further comprising doubling a frequency of the response of the sensor by the modulating.

12. The method of claim 10, wherein providing the supply voltage comprises amplifying the output of the second sensor configuration.

13. The method of claim 10, wherein the first sensor configuration and the second sensor configuration are first and second Wheatstone bridge sensor configurations, respectively.

14. The method of claim 13, wherein providing a magnetoresistive sensor comprises providing at least one of a giant magnetoresistive sensor (GMR), a tunneling magnetoresistive sensor (TMR) or an anisotropic magnetoresistive sensor (AMR).

15. The method of claim 9, wherein providing a sensor comprises providing a magnetoresistive sensor.

16. A sensor system comprising:
a magnetoresistive sensor comprising a first sensor element configuration and a second sensor element configuration,
wherein in a first mode of operation, the second sensor element configuration is configured to output a modulated output voltage, and further configured to modulate a supply voltage of the first sensor element configuration with a modulation frequency according to the modulated output voltage, and wherein an output signal of the first sensor element configuration has double a frequency of the modulated output voltage output by the second sensor element configuration.

17. The sensor system of claim 16, further comprising a switch configured to select between the first mode of operation and a second mode of operation.

18. The sensor system of claim 17, wherein, when in the second mode of operation, a substantially constant supply voltage is provided to the first sensor element configuration.

19. The sensor system of claim 16, further comprising amplifier circuitry to amplify the output signal of the second sensor element configuration.

20. The sensor system of claim 16, wherein the magnetoresistive sensor comprises at least one of a giant magnetoresistive sensor (GMR), a tunneling magnetoresistive sensor (TMR) or an anisotropic magnetoresistive sensor (AMR).

21. The sensor system of claim 16, wherein in the first mode of operation, the first sensor element configuration provides a halved range of angular uniqueness compared to in the second mode of operation.

22. A sensor system for measuring a parameter of a rotating magnetic field comprising:
a first magnetoresistive (xMR) sensor bridge; and
in a first mode of operation,
a second xMR sensor bridge having an output coupled to an input of the first xMR sensor bridge, wherein the first and second xMR sensor bridges are coupled to each other such that a signal tapped from the first xMR sensor bridge has double a frequency of the rotating magnetic field, wherein the first and second xMR sensor bridges are coupled to each other such that at least one operating parameter of the first xMR sensor bridge is influenced by the second xMR sensor bridge.

23. The sensor system of claim 22, wherein a change in the frequency of the rotating magnetic field produces a corresponding change in the at least one operating parameter.

24. The sensor system according to claim 22, further comprising a switch configured to switch between the first mode of operation and a second mode of operation.

25. The sensor system according to claim 24, wherein in the second mode of operation, the switch is configured to provide a substantially constant supply voltage to the first sensor element configuration.

26. A sensor system comprising:
a magnetoresistive sensor comprising a first sensor element configuration and a second sensor element configuration,
wherein:
   in a first mode of operation, the second sensor element configuration is configured to output a modulated output voltage, and further configured to modulate a supply voltage of the first sensor element configuration with a modulation frequency according to the modulated output voltage,
   in a second mode of operation, a substantially constant supply voltage is provided to the first sensor element configuration, and
   in the first mode of operation, a substantially doubled angular resolution is provided compared to during the second mode of operation; and
a switch configured to select between the first mode of operation and the second mode of operation.

* * * * *